United States Patent
Mahapatra et al.

(10) Patent No.: US 6,436,208 B1
(45) Date of Patent: Aug. 20, 2002

(54) PROCESS FOR PREPARING ALIGNED IN-SITU TWO PHASE SINGLE CRYSTAL COMPOSITES OF TITANIUM-NIOBIUM ALLOYS

(75) Inventors: Rabindra Mahapatra, Port Tobacco, MD (US); Eui W. Lee, Maple Glen; Jeffrey Waldman, Huntington Valley, both of PA (US); John H. Perepezko, Madison, WI (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/837,900

(22) Filed: Apr. 19, 2001

(51) Int. Cl.$^7$ .......................... C22C 14/00; C30B 13/34
(52) U.S. Cl. ...................... 148/562; 148/404; 148/421; 420/418; 117/41
(58) Field of Search ................................ 148/562, 404, 148/421; 420/418; 117/41

(56) References Cited

U.S. PATENT DOCUMENTS

| | | | |
|---|---|---|---|
| 4,323,418 A | * | 4/1982 | Kobayashi et al. |
| 4,716,020 A | * | 12/1987 | Blackburn et al. ........... 420/418 |
| 4,842,819 A | * | 6/1989 | Huang et al. ................ 420/418 |
| 4,857,268 A | * | 8/1989 | Huang et al. ................ 420/418 |
| 4,879,092 A | * | 11/1989 | Huang ........................ 420/418 |
| 4,897,127 A | * | 1/1990 | Huang ........................ 420/418 |
| 4,902,474 A | * | 2/1990 | Huang et al. ................ 420/418 |
| 4,916,028 A | * | 4/1990 | Huang ........................ 420/418 |
| 5,393,356 A | | 2/1995 | Singheiser ................... 148/421 |
| 5,690,734 A | * | 11/1997 | Imaeda et al. ................. 117/18 |
| 6,132,526 A | | 10/2000 | Carisey ....................... 148/407 |

FOREIGN PATENT DOCUMENTS

JP        07-082087        *    3/1995

OTHER PUBLICATIONS

Minerals, Metals and Materials Society (1991), by R. Mahapatra et al., "Effects of Thermal Processing on the Microstructure of a Ti–44Al–11Nb Alloy", Low Density, high Temperature Powder Metallergy Alloys, pp. 71–76.

* cited by examiner

Primary Examiner—George Wyszomierski
(74) Attorney, Agent, or Firm—Ron Billi

(57) ABSTRACT

A process of preparing aligned, in-situ, two-phase single crystal alloys of titanium, aluminum and niobium which comprises growing the alloys at rates of about 3.0 mm. to about 6.0 mm. per hour by rotating a seed rod alloy consisting essentially of Ti-43 to 45 Al-10 to 12 Nb+0.5 Si, in atomic percent, at about 7.75 to 8.25 RPM while in contact with a rotating feed rod alloy consisting essentially of Ti-43 to 45 Al-10 to 12 Nb, in atomic-percent, rotating at about 5.75 to 6.25 RPM in an atmosphere of substantially pure argon at melt temperatures ranging from about 1650° C. to 1750° C. to obtain two-phase single crystal alloys of Ti-43 to 45Al-10 to 12 Nb characterized as having improved ductility, excellent oxidation resistance, and high-temperature creep strength. These alloys are particularly useful for manufacturing high-temperature material components for internal combustion engines, gas turbines, and advanced aircraft engines.

6 Claims, 4 Drawing Sheets

Ti-44Al-11Nb ALLOY

PROCESS FOR PREPARING ALIGNED IN-SITU TWO PHASE SINGLE CRYSTAL COMPOSITES OF TITANIUM-NIOBIUM ALLOYS

ORIGIN OF THE INVENTION

The invention described herein was made by an employee of the United States Government and may be manufactured and used by or for the Government for governmental purposes without the payment of any royalties thereon or therefor.

BACKGROUND OF THE INVENTION

1. Field of the Invention

This invention relates to a process of preparing aligned, in-situ, two-phase single crystal composites of titanium-aluminum-niobium alloys having improved room temperature ductility, oxidation resistance and high temperature creep strength. More specifically, this invention relates to a process of preparing high-temperature materials made from an alloy of titanium-aluminum-niobium (Ti—Al—Nb) especially useful in internal combustion engines, gas turbines, aircraft engines, and the like.

2. Description of Prior Art

Extensive research has been devoted to the development of intermetallic materials, such as titanium aluminides, for use in the manufacture of light weight structural components capable of withstanding high temperatures and stress. Alloys based on the intermetallic TiAl are candidate materials for use in high temperatures and aggressive environments, such as those encountered in many aerospace applications. The benefits of using TiAl based alloys in engine components are their high-melting points and low densities compared to other high temperature, high strength alloys. Thus, TiAl alloys offer the possibility of attractive properties at considerable savings in weight. The major problem limiting the practical use of the alloys is its poor ductility and formability at low temperatures. Attempts have been made to improve the ductility of these alloys through the addition of alloying elements such as Ta, Mn and Nb. For example, U.S. Pat. Nos. 4,842,819; 4,857,268; 4,879,092; 4,897,127; 4,902,474; and 4,916,028, describe TiAl intermetallic materials having one or more alloys to improve room temperature strength and ductility. The addition of Nb or Nb and C, is described in these patents. Specifically, U.S. Pat. No. 4,716,020 describes titanium-based intermetallic alloys containing from 24 to 27% Al, and 11 to 16% Nb.

SUMMARY OF THE INVENTION

This invention relates to the process of preparing aligned, in-situ, two-phase single crystal. alloys of titanium-aluminum-niobium (Ti43 to 45 Al-10 to 12 Nb in atomic percent) which comprises growing the two-phase single crystal alloys at rates of about 3.0 to 6.0 and preferably from about 3.5 mm. to 5.0 mm. per hour by rotating a seed rod alloy consisting essentially of Ti-43 to 45 Al-10 to 12 Nb+0.5 Si, in atomic percent, at about 7.75 to 8.5 RPM (rounds per minute) and preferably about 8.0 RPM while in contact with a rotating feed rod alloy consisting essentially of Ti-43 to 45 Al-10 to 12 Nb, in atomic percent rotating at about 5.75 to 6.5 RPM and preferably about 6.0 RPM in an atmosphere of substantially pure inert gas such as argon at melt temperatures ranging from about 1650° C. to 1750° C. and preferably at about 1700° C. to 1730° C. to obtain two-phase single crystal alloys consisting essentially of Ti-43-45 Al-10 to 12 Nb, in atomic percent. The two-phase single crystal composites of titanium-aluminum niobium are characterized as having improved ductility, excellent oxidation resistance, and high-temperature creep strength.

Accordingly, it is an object of this invention to provide a process of preparing a two-phase single crystal, in-situ, composites of titanium-aluminum-niobium alloy that has excellent oxidation resistance at high temperatures.

It is another object of this invention to provide a process of preparing two-phase single crystal alloys, in-situ, composites of Ti—Al—Nb having improved room temperature ductility and high temperature creep strength.

It is a further object of this invention to provide a process of preparing alloys characterized as having high strength and acceptable ductility for use in high temperature applications.

The above and other objects of this invention will become apparent from the following description of the preferred embodiments in combination with the accompanying drawings.

DESCRIPTION OF THE DRAWINGS

FIG. 1—1200° C. isothermal section of the titanium-aluminum-niobium phase diagram, showing $T_2$ phase region.

DESCRIPTION OF THE PREFERRED EMBODIMENT

More specifically, this invention relates to a process of preparing aligned, in-situ, two-phase single crystal alloys of titanium, aluminum, and niobium which comprises growing the two-phase single crystal alloys at a rate of about 3.0 mm. to about 6.0 mm. per hour by rotating a seed rod alloy consisting essentially of Ti-43 to 45 Al-10 to 12 Nb+0.5 Si, in atomic percent, at about 7.75 to 8.25 RPM while in contact with a rotating feed rod alloy consisting essentially of Ti43-45 Al-10 to 12 Nb, in atomic percent, rotating at about 5.75 to 6.25, RPM in an atmosphere of substantially pure inert gas at melt temperatures ranging from about 1650° C. to 1750° C. to obtain two-phase single crystal alloys of Ti-43 to 45 Al-10 to 12 Nb, in atomic percent, characterized as having improved ductility, oxidation resistance and high-temperature creep strength. Preferably, the inert gas is argon, the seed rod consists of Ti-44Al-11Nb+0.5 Si and the feed rod consists of Ti44Al-11Nb. These specific two-phase single crystal alloys grow at rates of about 3.5 mm. to 5.0 mm. per hour by rotating the seed rod at about 8.0 RPM while in contact with a feed rod rotating at about 6.0 RPM at melt temperatures of about 1700° C. to 1730° C.

The phase diagram for the ternary system of this invention has been investigated in detail. The results of the investigation indicates the presence of a $T_2$ phase at 1200° C. in the phase diagram near the Ti-44Al-11Nb alloy composition, see FIG. 1. A preliminary study of the polycrystalline materials of this alloy indicates that this alloy retains its strength at temperatures as high as 950° C. and has excellent oxidation resistance at this temperature. A detailed microstructural analysis suggest that the $T_2$ phase is based $B_2$ (CsCl) structure. Moreover, this phase is cooling rate sensitive, so that an aligned, in-situ, composite microstructure is developed by employing special thermal processing methods. The benefits of an aligned, in-situ, composite microstructure are the improved room temperature ductility, high-temperature oxidation resistance and creep strength in specific orientations.

The processing parameters to produce the, in-situ, composites of the alloy are extremely sensitive and restricted to a narrow window. This is believed to be related to the solidification pathway of this alloy. The alloy composition also has a very restrictive range and must remain in the $T_2$ phase region in order to produce the, in-situ, composites of this alloy.

The preferred alloy of this invention consist of the following:

| Elements: | | | | | | |
|---|---|---|---|---|---|---|
| Ti | Al | Nb | C | O | N | H |
| Atomic % 44.97 | 43.93 | 10.98 | 0.084 | 560 ppm | 88 ppm | 14 ppm |

Figure 1:
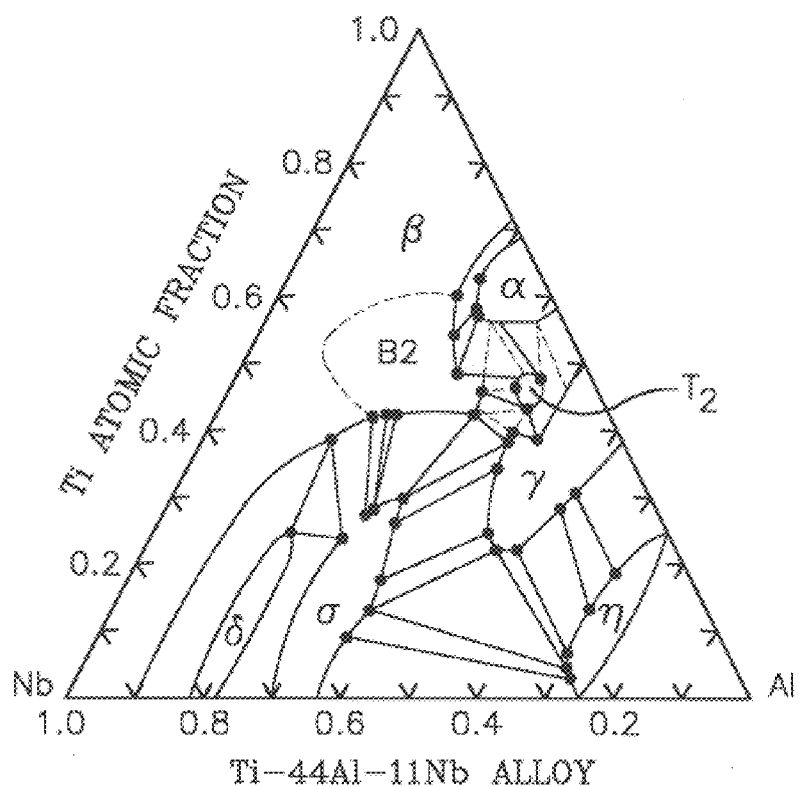

The starting alloy composition is well within the $T_2$ phase region of the phase diagram of FIG. 1. The process of this invention comprises preparing the alloy compositions with the following variables:

| Elements | Atomic % |
|---|---|
| Al | 43–45 |
| Nb | 10–12 |
| Ti | Balance |

Processing Variables For Two-Phase Single Crystal Growth includes:

| | |
|---|---|
| Melt Temperatures | 1650°–1750° C. |
| | 1700°–1730° C. (preferred) |
| Solidification Rate/Growth Rate | 3.0 mm/hr to 6.0 mm/hr |
| | 3.5 mm/hr to 5.0 mm/hr (preferred) |
| Rotation Rates | |
| Seed Rod | 7.75 to 8.25 RPM (rounds per minute) |
| | 8.0 RPM (preferred) |
| Feed Rod | 5.75–6.25 RPM |
| | 6.0 RPM (preferred) |

Alloy Preparation

Alloys with the nominal composition of Ti-44Al-11Nb (in atomic %) were made using titanium, aluminum and niobium with 99.998% purity level. Melting was performed in an arc-meter in a gettered argon atmosphere to produce buttons approximately 13 mm diameter. The buttons were inverted and remelted at least three times to ensure complete homogeneity. These arc-melted buttons were then remelted in an arc furnace to produce rods of 12 mm diameter and 150 mm long. The rods were turned over and remelted at least two times in the arc furnace. These rods were used as feed rods for growing aligned two-phase single crystal, in-situ, composites of Ti-44Al-11Nb alloy. The seed rods were prepared in the similar manner, except the alloy composition was Ti-44Al-11Nb+0.5 Si (atomic %). The seed crystal composition with 0. 5% silicon was essential to grow aligned two-phase single crystal in-situ composites of this alloy.

The Preferred Two-Phase Single Crystal Processing

Figure 8:
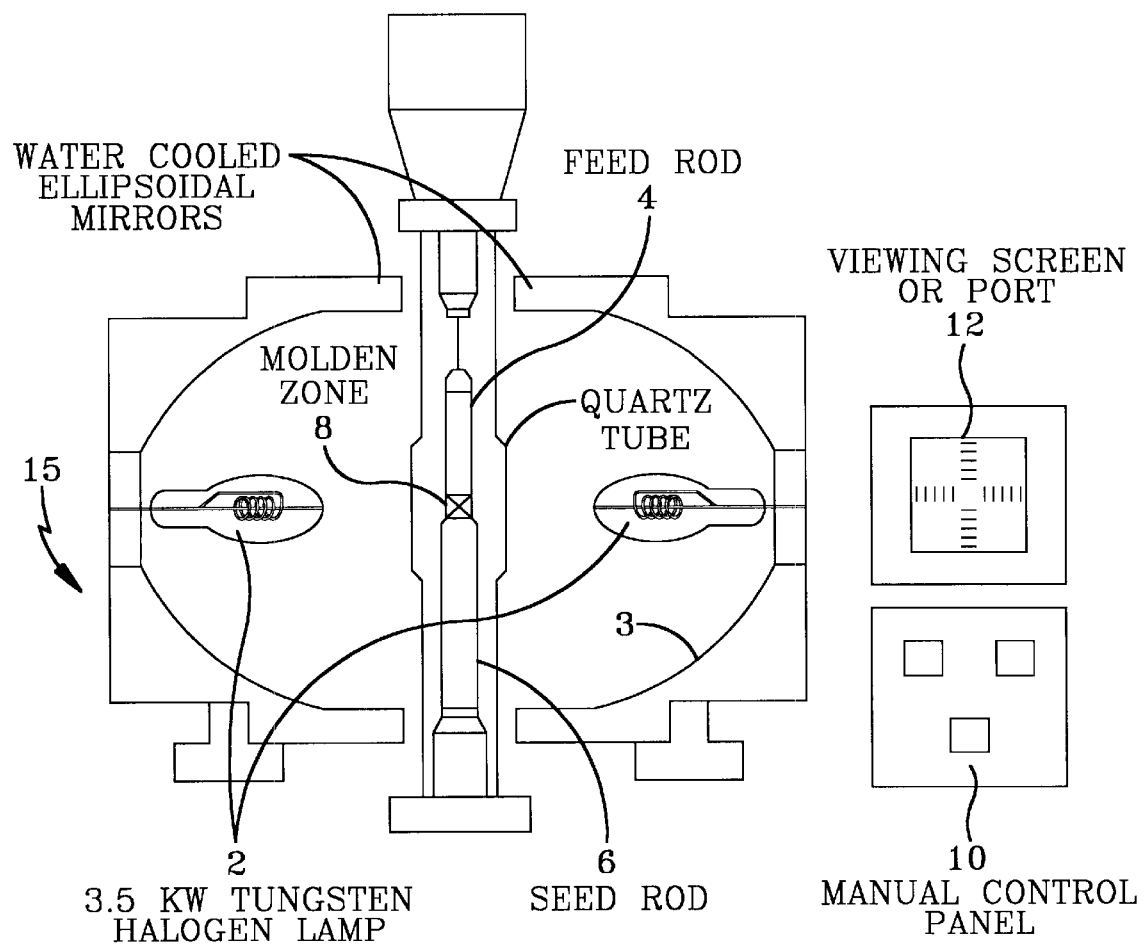
FIG. 8 shows the cross-section of the Optical Imaging Floating Zone (OIFZ) crystal growth furnace used in preparing the two-phase single crystal, in-situ, composite alloys of this invention.

As shown in FIG. 8, an ASGAL (FZ-SS35W) Optical Imaging Floating Zone (OIFZ) furnace 15 was used to grow the aligned in-situ two-phase single crystal composites of the alloy: 10 mm diameter and 75 mm long at a growth rate of about 3.5 mm-5mm/hour. The main features of this furnace 15 are the two 3.5 kW tungsten halogen lamps 2 enclosed in a double ellipsoid gold-plated water-cooled chamber 3. The feed rod 4 and seed rod 6 were aligned perpendicular to the long axis of the double ellipsoid while the molten zone 8 was produced at the overlapping focal point. The growth process was visually monitored through an opening in the chamber using an optical system which projects the image of the molten zone 8 and surroundings on the ground glass in the viewing screen or port 12. The manual control panel 10 located below the viewing screen or port 12 provided the operator the ability to adjust the crystal diameter instantaneously by either squeezing or stretching the molten zone 8. The growth conditions, e.g. growth rate, power level, and rotation rates of feed and seed rods were varied (using the critical process parameters) in order to produce aligned two-phase single crystal in-situ composites of this specific alloy composition.

The following process variables are most preferred in order to grow the in-situ composite alloys of this invention:

| | |
|---|---|
| Melt Temperature | 1700° C. (Min)–1730° C. (Max) |
| Solidification Rate | 3.5 mm/hour (Min)–5 mm/hour (Max) |
| Rotation Rate of Seed Rod | 8 RPM (optimum) |
| Rotation Rate of Feed Rod | 6 RPM (optimum) |
| Furnace Atmosphere | Argon (99.998% pure) @ 3 psi |
| Seed Crystal Composition | Ti-44 Al-11 Nb-0.5 Si (atomic %) (optimum) |

The advantages of using the optical imaging floating zone technique for crystal growth is that it is containerless which fully eliminates the possibility of interactions between a mold and the Ti-44Al-11Nb alloy being processed. The resulting crystals were frequently free of porosity. This is due to the continual filling of the voids from the liquid zone.

Mechanical Properties

The lamellar $\alpha_2+\gamma$ microstructure and unique orientation relationships between $\alpha_2$, and $\gamma$ phases in two phase gamma titanium aluminides render the alloys suitable for controlling by directional solidification the morphologies and orientations of the two phases and thus, modifying the properties in a manner analogous to directionally solidified eutectic and directionally transformed eutectoid alloys. Ti-(48-50) Al alloys initially solidify in a disordered alpha h.c.p. (hexagonal close packed) form, undergoes the solid state transformation $\alpha \rightarrow \alpha2(s) \rightarrow \alpha2+\gamma$ during cooling resulting in a lamellar morphology with orientation relationships as follows:

(0001)α//{111}γ, and

<1120>α₂//<110>γ

The unique orientation of the basal plane normal in the parent alpha h.c.p phase determines the eventual orientation of the flat slabs in the polycrystalline aggregate. The relative thickness of the laths varies with alloy composition and lamellar α₂/γ grain volume ratio. The α₂ plates become thinner with increasing aluminum content and/or α₂/γ ratio. The stability of the lamellar phase depends on its volume fraction, which is a function of the α₂/γ phase volume ratio, which is itself dependent on alloy composition.

Figure 6:
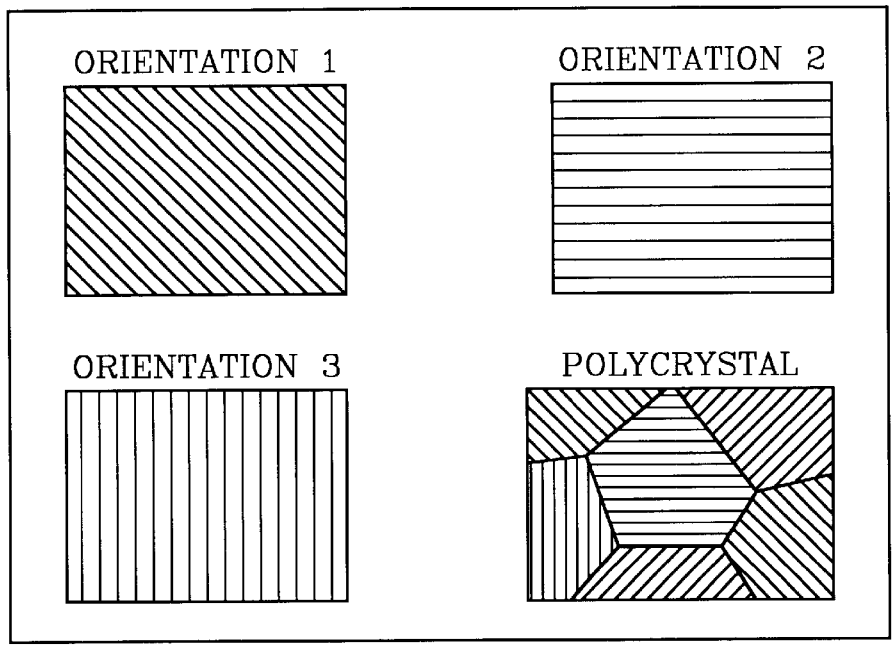
FIG. 6 shows orientation of specimens tested under three point bending test.
Figure 7A:
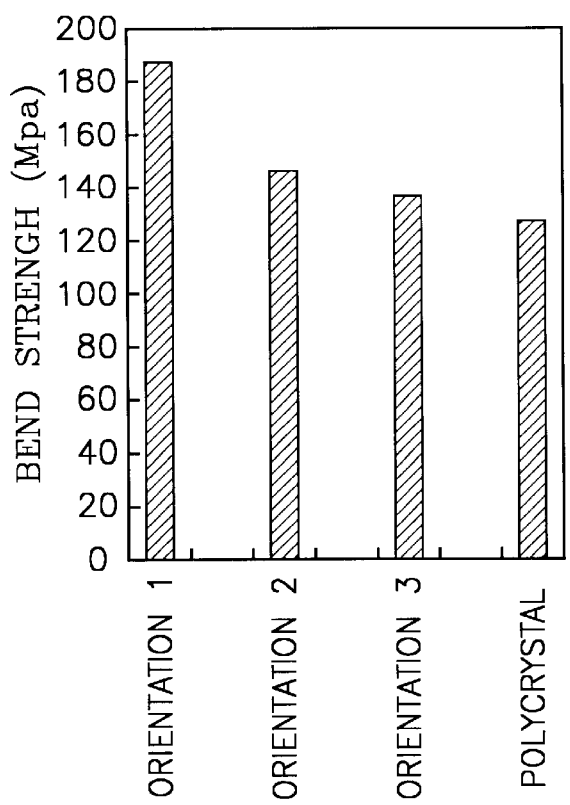
FIGS. 7a and 7b show bend strengths and ductilities of directional solidified Ti44 Al-11 Nb alloy of different orientations.
Figure 7B:
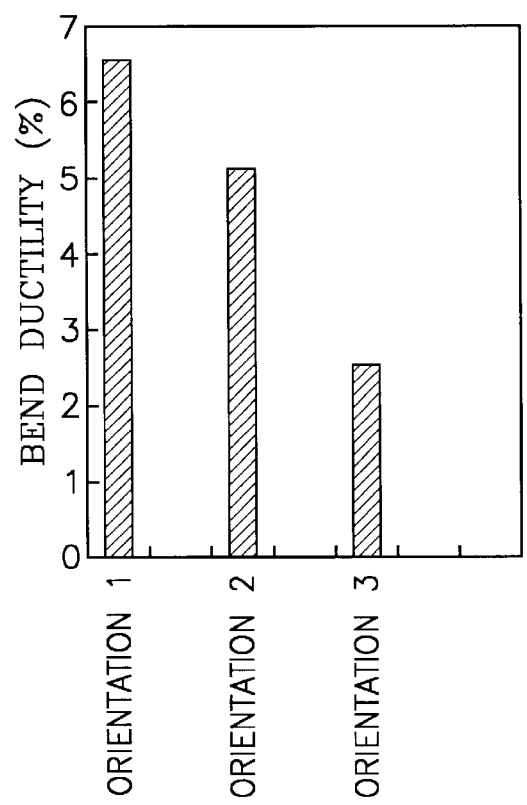

The property improvements resulting from varying the orientation of α₂ and γ laths were studied in directionally solidified single crystals of two phase Ti-44Al-11Nb alloy. Directionally solidified crystals of orientations 1,2, and 3 and a polycrystalline Ti-44Al-11Nb, shown in FIG. 6, were tested under 3-point loading conditions. In directionally solidified specimens, a strong orientation-dependent anisotropy of flow stress and ductility was observed as shown in FIGS. 7a and 7b. Flow stresses are lower and elongations to fracture are higher in crystals oriented such that the shear deformation parallel to the slabs is easier. The results indicate that directional solidification is an effective method for ductility improvement of the Ti-44Al-11Nb alloy. This unique process produced an oriented lamellar microstructure.

Figure 2:
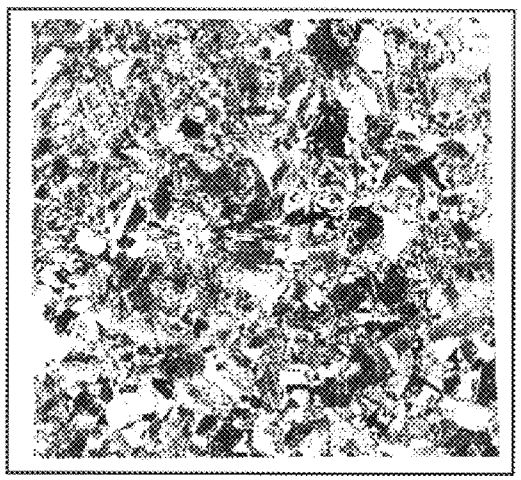
FIG. 2—Optical micrograph of arc melted Ti44 atomic % Al-11 atomic % Nb alloy showing non-uniform distribution of lamellar phases.
Figure 3:
FIG. 3—TEM micrograph of arc melted Ti-44 atomic % Al-11 atomic % Nb alloy showing dislocations and lamellar structure.

The solidification microstructure for the arc-melted alloy is shown in FIG. 2 and consists of a partially homogenized as-cast structure containing an α₂+γ lamellar two phase structure. The absence of a clearly defined dendritic morphology and the associated segregation pattern is a characteristic of Ti—Al—Nb alloys that form primary bcc (body center cubic) phase during solidification. Since the alloy was fast cooled during the arc melting process, the grain size is relatively small (approximately 15 μm). FIG. 3 shows the TEM micrograph of the arc-melted alloy. A large number of dislocations generated during cooling are present. The dislocations are believed to be generated due to the difference in the coefficient of thermal expansion of lamella associated with a fast cooling rate. A non-uniform random distribution of lamella is evident in this microstructure and is believed that this cooling rate caused the non-uniform distribution of lamella.

Figure 4:
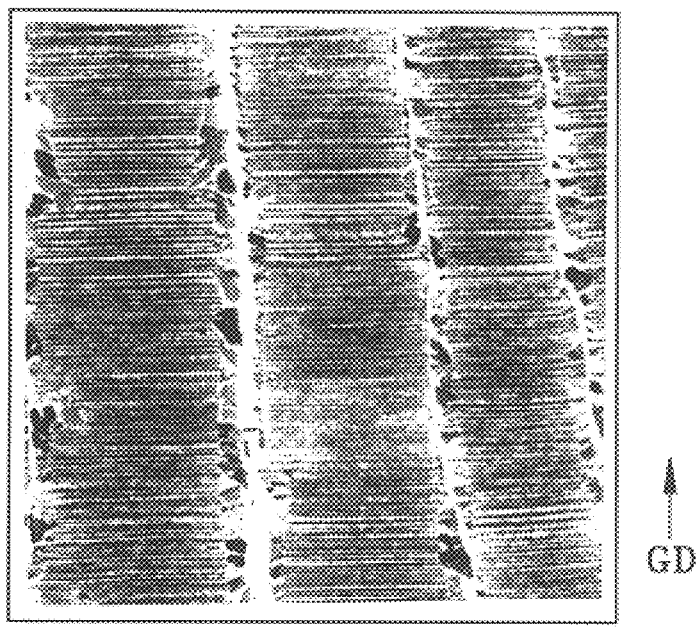
FIG. 4—Optical micrograph of a two-phase single crystal Ti-44 atomic % Al-11 atomic % Nb alloy showing uniform distribution of lamellar phase throughout the specimen. The arrow indicates the direction of solidification.
Figure 5:
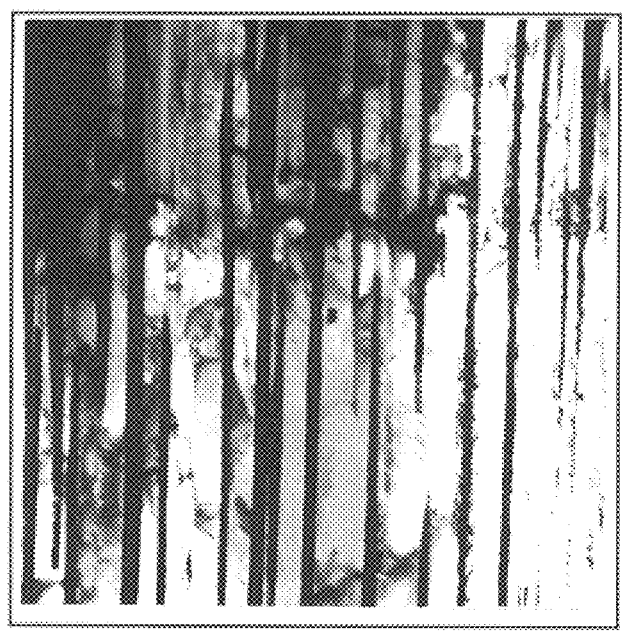
FIG. 5—TEM micrograph of a two-phase single crystal Ti-44 atomic % Al-11 atomic % Nb alloy showing lamellar microstructure.

The optical micrograph of the two-phase single crystal specimen of the alloy processed using the specific processing parameters is illustrated in FIG. 4. The arrow in FIG. 4 indicates the direction of solidification. The microstructure consists of a uniformly and directionally oriented lamellar structure throughout the specimen. The two-phase single crystal specimen showed a fully aligned lamellar structure having uniform length and distribution. The TEM micrograph of the specimen is shown in FIG. 5. This also shows the complete alignment and uniform distribution of the lamella.

The two-phase single crystal aligned in-situ composite alloys of this invention provides: (a) improved room temperature ductility (b) weight savings due to their lower density and (c) improved high temperature creep strength relative to nickel base superalloys currently used for engine applications. The alloy composites of this invention have excellent oxidation resistance e.g. 0.30 mg/cm² at 900° C. in air for 180 hours, and 1.5 mg/cm² at 1000° C. in air for 180 hours.

While this invention has been described by a number of specific examples, it is obvious that there are other variations and modifications which can be made without departing from the spirit and scope of the invention as particularly set forth in the appended claims.

What is claimed is:

1. A process of preparing aligned, in-situ, two-phase single crystal alloys of titanium, aluminum, and niobium which comprises growing the two-phase single crystal alloys at a rate of about 3.0 mm. to about 6.0 mm. per hour by rotating a seed rod alloy consisting essentially of Ti-43 to 45 Al-10 to 12 Nb+0.5 Si, in atomic percent, at about 7.75 to 8.25 RPM while in contact with a rotating feed rod alloy consisting essentially of Ti-43-45Al-10 to 12 Nb, in atomic percent, rotating at about 5.75 to 6.25 RPM in an atmosphere of substantially pure inert gas at melt temperatures ranging from about 1650° C. to 1750° C. to obtain two-phase single crystal alloys of Ti-43 to 45 Al-10 to 12 Nb, in atomic percent, characterized as having good ductility, oxidation resistance and high-temperature creep strength.

2. The process of claim 1 wherein the inert gas is argon and the seed rod consists of Ti-44Al-11Nb+0.5 Si and the feed rod consists of Ti-44Al-11Nb.

3. The process of claim 2 wherein two-phase single crystal alloys grow at a rate of about 3.5 mm. to 5.10 mm. per hour by rotating the seed rod at about 8.0 RPM while rotating the feed rod at about 6.0 RPM at melt temperatures of about 1700° C. to 1730° C.

4. The aligned two-phase single crystal alloys obtained by the process of claim 1.

5. The aligned two-phase single crystal alloy obtained by the process of claim 2.

6. The aligned two-phase single crystal alloy obtained by the process of claim 3.

* * * * *